United States Patent [19]
Ogura et al.

[11] Patent Number: 6,038,169
[45] Date of Patent: Mar. 14, 2000

[54] READ REFERENCE SCHEME FOR FLASH MEMORY

[75] Inventors: Seiki Ogura; Tomoko Ogura, both of Wappingers Falls, N.Y.

[73] Assignee: Halo LSI Design & Device Technology, Inc., Wappingers Falls, N.Y.

[21] Appl. No.: 09/270,596

[22] Filed: Mar. 18, 1999

[51] Int. Cl.[7] .................................................. G11C 16/04
[52] U.S. Cl. ............................. 365/185.11; 365/185.2; 365/185.33
[58] Field of Search .................... 365/185.05, 185.11, 365/185.18, 185.2, 185.33

[56] References Cited

U.S. PATENT DOCUMENTS

| | | | |
|---|---|---|---|
| 5,172,338 | 12/1992 | Mehrotra et al. | 365/185 |
| 5,289,412 | 2/1994 | Frary et al. | 365/185 |
| 5,485,422 | 1/1996 | Bauer et al. | 365/168 |
| 5,544,116 | 8/1996 | Chao et al. | 365/210 |
| 5,596,527 | 1/1997 | Tomioka et al. | 365/185.2 |
| 5,629,892 | 5/1997 | Tang | 365/185.2 |
| 5,638,326 | 6/1997 | Hollmer et al. | 365/185.2 |
| 5,754,475 | 5/1998 | Bill et al. | 365/185.25 |
| 5,771,192 | 6/1998 | Kim et al. | 365/185.17 |
| 5,912,837 | 6/1999 | Lakhani | 365/185.02 |
| 5,946,258 | 8/1999 | Evertt et al. | 365/226 |

*Primary Examiner*—David Nelms
*Assistant Examiner*—Gene N. Auduong
*Attorney, Agent, or Firm*—George O. Saile; Stephen B. Ackerman

[57] ABSTRACT

In this invention a reference circuit is disclosed that produces a reference current to be used in determining the value of data in a flash memory cell. The memory cell current is compared to the reference current in a sense amplifier. A reference circuit that generates the reference current is connect to each bit line of the flash memory and uses bit lines that are not activated when a particular cell is being read to connect the reference current to the sense amplifiers. The use of a reference current allows multi-bit cells to be read by using a variation on the reference circuit that has a plurality of reference transistors creating a plurality of reference currents.. Verification of the programmed and erase states of a flash memory cell can be determined using different values of the reference current that are easily set in the reference circuit by changing a reference voltage.

17 Claims, 3 Drawing Sheets

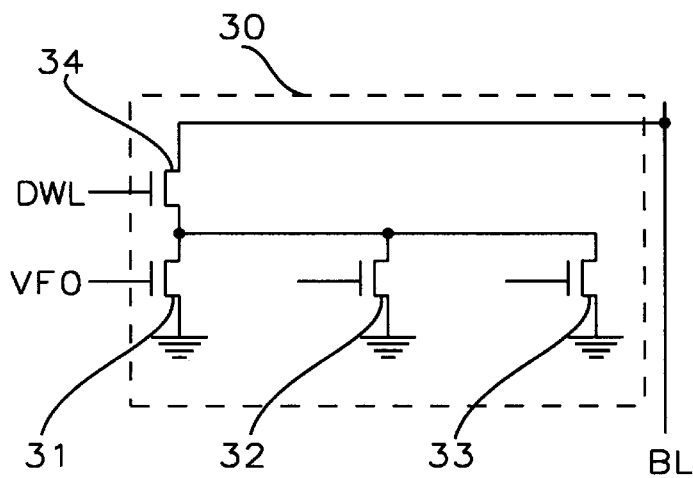
FIG. 3a
| Mode | $V_F$ | $I_{REF}$ |
|---|---|---|
| Read | 1.5V | 35uA |
| Program Verify | 1.0V | 10uA |
| Erase Verify | 2.0V | 60uA |
FIG. 4
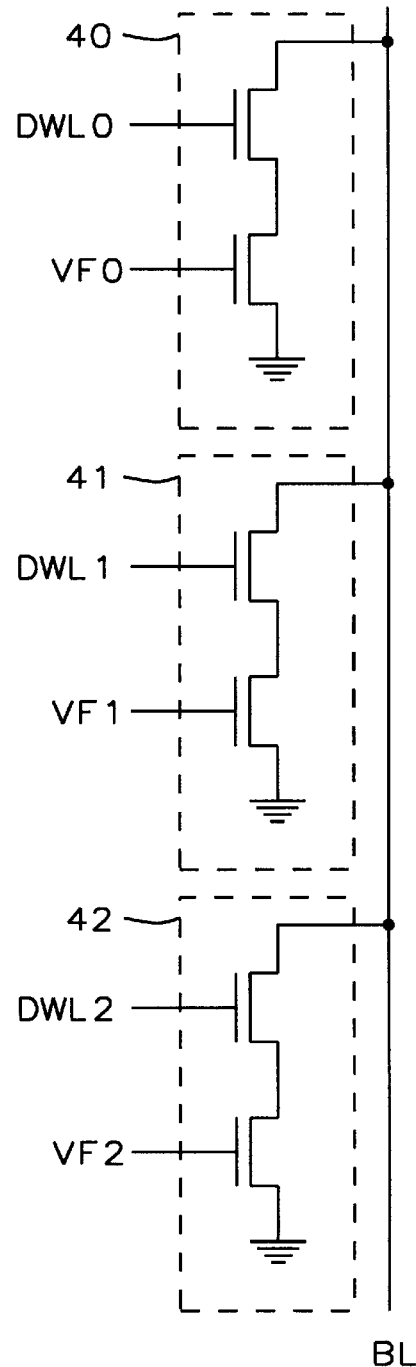
FIG. 3b

READ REFERENCE SCHEME FOR FLASH MEMORY

BACKGROUND OF THE INVENTION

1. Field of Invention

This invention relates to flash memory and in particular to creating a reference by which to read the state of flash memory cells.

2. Description of Related Art

Reading data from a flash memory cell requires some method of determining whether the signal produced by the cell on a bit line is a logical "1" or a logical "0". A common method is to use a differential sense amplifier in which a reference is connected to one input leg of the amplifier. In some cases the sense amplifier compares a bit line voltage to a DC reference voltage. This sensing method is slow because time must be allotted to allow the bit line to settle. Other schemes use a dynamic sensing method in which a reference current is used. In the dynamic sensing scheme a half current is set up to detect between a "0" state and a "1" state. One of the challenges is to design a reference circuit which produces an output current that with tracks the memory cells for which it is used to read. Also memory cells are connected to bit lines and the capacitive loading effects of the bit lines needs to be matched by die reference circuit to produce similar performance between the memory cells and die reference circuits.

In U.S. Pat. No. 5,771,192 (Kim et al.) a two transistor reference circuit provides a reference voltage for reading a flash memory cell through an unused bit line to a page buffer that includes a pair of cross coupled buffers. One of the two transistors acts as a gate and the other as the reference voltage source. This invention compares the bit line voltage of a memory cell being read to the bit line voltage of the reference circuit to determine the value of the data being read. This invention does not disclose a current sensing scheme nor an application for a multi-bit flash memory application. U.S. Pat. No. 5,754,475 (Bill et al.) describes a reference scheme for a multi-bit flash memory in which multiple reference cells are arranged in rows and columns. The number of rows corresponds to the number of rows in the flash memory and the number of columns depends on the number of bits in the multi-bit memory cells.

In U.S. Pat. No. 5,638,326 (Hollmer et al.) a flash memory read and verify circuit is disclosed that minimizes by design the effects of process, power and temperature variations. The read and verify circuit uses a bias circuit with a cascode transistor for the reference. In U.S. Pat. No. 5,629,892 (Tang) a flash memory is described where an array of reference cells is separate from the array of memory cells. The transconductance of the reference cells is matched to the transconductance of the memory cells to produce a reference current. In U.S. Pat. No. 5,596,527 (Tomioka et al.) is described a multi-bit flash memory with multiple reference cells providing a multiple of threshold voltages. The reference cells are made up from memory cells, and the multiple reference cells associated with a word line of memory cells are accessed using the same wordline as used for the memory cells. In U.S. Pat. No. 5,544,116 (Chao et al.) a program and erase verify circuit is disclosed in which different voltages are supplied to the memory and reference cells to read the program and erase verify conditions. In U.S. Pat. No. 5,172,338 (Mehrotra et al.) a set of reference cells which closely track the multi-bit flash memory cells are used for read and erase verification.

There are many approaches to reading flash memory cell data. Those approaches that utilize a differential sense amplifier use a reference cell to generate a reference voltage or current to compare with the bit line signal. In DC sensing schemes the bit line needs to settle before a comparison is made to a reference voltage. The need to allow settling time makes the operation slow, and therefore a dynamic sensing scheme where the sense amplifier uses a current reference is more advantageous. In dynamic read sensing a half current is often used which is generated/ from a reference circuit that tracks with the memory cell and has a threshold voltage which is half that of the memory cell. The half threshold voltage of the reference cell produces a reference current that is half the current between a logical "0" and a logical "1" of the memory cell. One of the challenges is how to build a reference circuit that tracks with the memory cell current changes with respect to process, temperature and power supply variations. Another problem is the capacitive loading of bit lines that slows the bit line voltage response and the comparison process. This is particularly important if voltage sensing is used. Turning on the memory cell and the reference cell at the same time is important to minimize settling errors. Better margin due to better cell tracking and load matching permits faster dynamic sensing.

In addition to the normal read operation, flash memory has two other read type operations, called "program Verify" and "erase verify", in which the memory cell threshold is compared to thresholds that are higher and lower than the half threshold reference. For simplicity of circuit design, it would be useful to incorporate capability to sense all the different reference levels within a single unit.

SUMMARY OF THE INVENTION

In this invention a read reference scheme is described for a flash memory where a bit line current is compared to a reference current. The reference current can be changed to allow program verify and erase verify of the memory cells. In addition multi-bit memory cells can be read by a multi-level current reference circuit or by multiple reference circuits. The reference circuits are connected to the bit lines of the flash memory array which is partitioned into at least two memory banks. As shown in FIG. 2, the two memory banks can be physically located to reside opposite each other on a flash memory chip with decoders and sense amplifiers located in between.

A row of reference circuits is placed into each memory bank with a reference circuit connected to each bit line. Since the reference circuits and the memory cells share the same bit lines, at least two memory banks are required where data is accessed in one memory bank and the reference circuits are access in the other bank. A first dummy word line, A-DWL, is connected to the reference circuits in the first memory bank and a second dummy wordline, B-DWL, separate from the first dummy wordline is connected to the reference circuits in the second memory bank. When a word line is activated to access data in one of the memory banks, data in terms of current is routed to sense amplifiers via the bit lines of the memory bank, and the dummy word line in the other memory bank is activated to supply the necessary reference current from the reference circuits to the sense amplifiers. The reference current is used to compare to the data current in order that the logical value of the stored data can be determined.

The reference current is controlled by a reference voltage connected to the gate of one of the two transistors in the reference circuit, shown in FIG. 1 and called here as the reference transistor. The source of the reference transistor is connected to a source line which is usually circuit ground;

although the source line could be connected to other voltages with appropriate adjustment to the gate voltage. The drain of the reference transistor is connected to the source of the second transistor of the reference circuit called the control transistor. The drain of the control transistor is connected to a bit line of one of the memory banks, and the gate of the control transistor is connected to a dummy word line. It should be noted that the order of the two transistors in the reference circuit may be switched so that the drain of the reference transistor is connected to the bit line and the source of the control transistor is connected to the source line. When the potential of a dummy word line is raised a reference current set by the reference voltage on the gate of the reference transistor is connected to a bit line and through the bit line to a sense amplifier.

The reference current can be changed by changing the reference voltage applied to the gate of the reference transistor. This allows this read reference scheme to erase verify and program verify a memory cell. An example of the reference voltages is shown in FIG. 4 that can be used to obtain reference currents for read, program verify and erase verify operations. If a reference voltage is set that produces a maximum "program" current, then any current less that the reference current will indicate that the memory cell is programmed. In similar manner if a reference voltage is set that produces a minimum "erase" current, then any current greater than the reference current will indicate that the memory cell has been erased.

A configuration which parallels a plurality of reference transistors, shown in FIG. 3a, allows multi-bit flash memory cells to be read. The drains of the plurality of reference circuits are connected together and further connected to the source of the control transistor. The control transistor providing one connecting to a bit line while supporting three separate reference currents. The sources of the plurality of reference transistors are connected together and further connected to the source line of the reference circuit. The gates of the plurality of reference transistors are independently controlled by independent reference voltages to produce a different reference current for each reference transistor. Only one reference voltage is connected to a gate of a reference transistor of the plurality of reference transistors with the other reference voltages grounded; however, a reference voltage scheme could be devised wherein one reference voltage produces the smallest current required and each additional reference voltage connected to an additional reference transistor creates an incremental current added to the previous current to reach the next required current level.

Another configuration, shown in FIG. 3b, that allows multi-bit flash memory cells to be read connects a plurality of reference circuits each containing a control transistor and one reference transistor to a bit line. In this case a plurality of control transistors are connected to the bit line and are controlled by separate dummy word lines. The reference transistors in each reference circuit are connected to separate reference voltages which control the current connected to the bit line from the reference circuits. Only one dummy wordline of the plurality of reference circuits is raised high at one time with the other dummy wordlines grounded. However, a reference voltage scheme could be devised wherein one reference voltage produces the smallest current required and each additional reference voltage connected to an additional reference circuit creates an incremental current which can be added to the previous current by enabling two or more dummy word lines in parallel to reach the next required current level. It is also possible that a plurality of reference transistors could be connected to a reference circuit connected to the same bit line as other reference circuits each having one or a plurality of reference transistors.

The reference circuit describe herein provides a flexible reference that can be used to provide reference currents for sensing multilevel flash memory cells. A single reference circuit may be used where the reference voltage is switched to establish different reference current levels, or several reference circuits connected to the same bit line can be used to produce the different reference currents necessary to read, program verify and erase verify the multilevel memory cells.

DESCRIPTION OF THE DRAWINGS

This invention will be described with reference to the accompanying drawings, wherein.

FIG. 3a is a diagram of a reference circuit with a plurality of reference transistors;

FIG. 3b is a diagram of a plurality of reference circuits connected to the same memory bit line;

FIG. 4 is a chart showing the relationship of the reference voltage and reference current to different modes.

DETAILED DESCRIPTION OF THE PREFERRED EMBODIMENT

Figure 1:
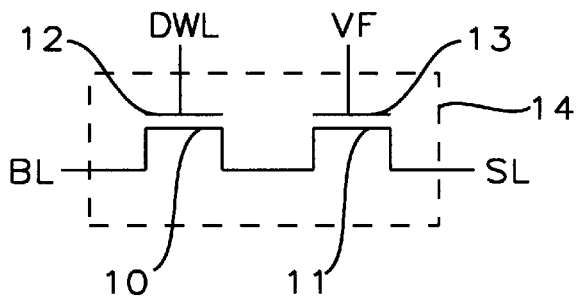
FIG. 1 is a diagram of the reference circuit of fins invention.

In FIG. 1 is shown a reference circuit 14 comprising two transistors, a control transistor 10 and a reference transistor 11, connected between a bit line BL and a source line SL. The source of control transistor 10 is connected to the drain of the reference transistor 11. The source of the reference transistor 11 is connected to a source line SL which is usually circuit ground, but a voltage could be connected to the source line SL during program verify and/or erase verify. The drain of control transistor 10 is connected to a bit line BL of a flash memory aid the bit line BL is shared with memory cells of a flash memory. A reference current is produced by the reference transistor 11 as a result of the reference voltage VF applied to gate 13 of the reference transistor. The control transistor 10 connects the reference current to the bit line BL under the control of the dummy word line DWL connected to the gate 12 of the control transistor. With the exception of floating gates the two transistors 10 and 11 are dimensioned similar to the transistors of the flash memory cells to permit similar transistor characteristics and allow for tracking of variations due to power, temperature and process.

Figure 2:
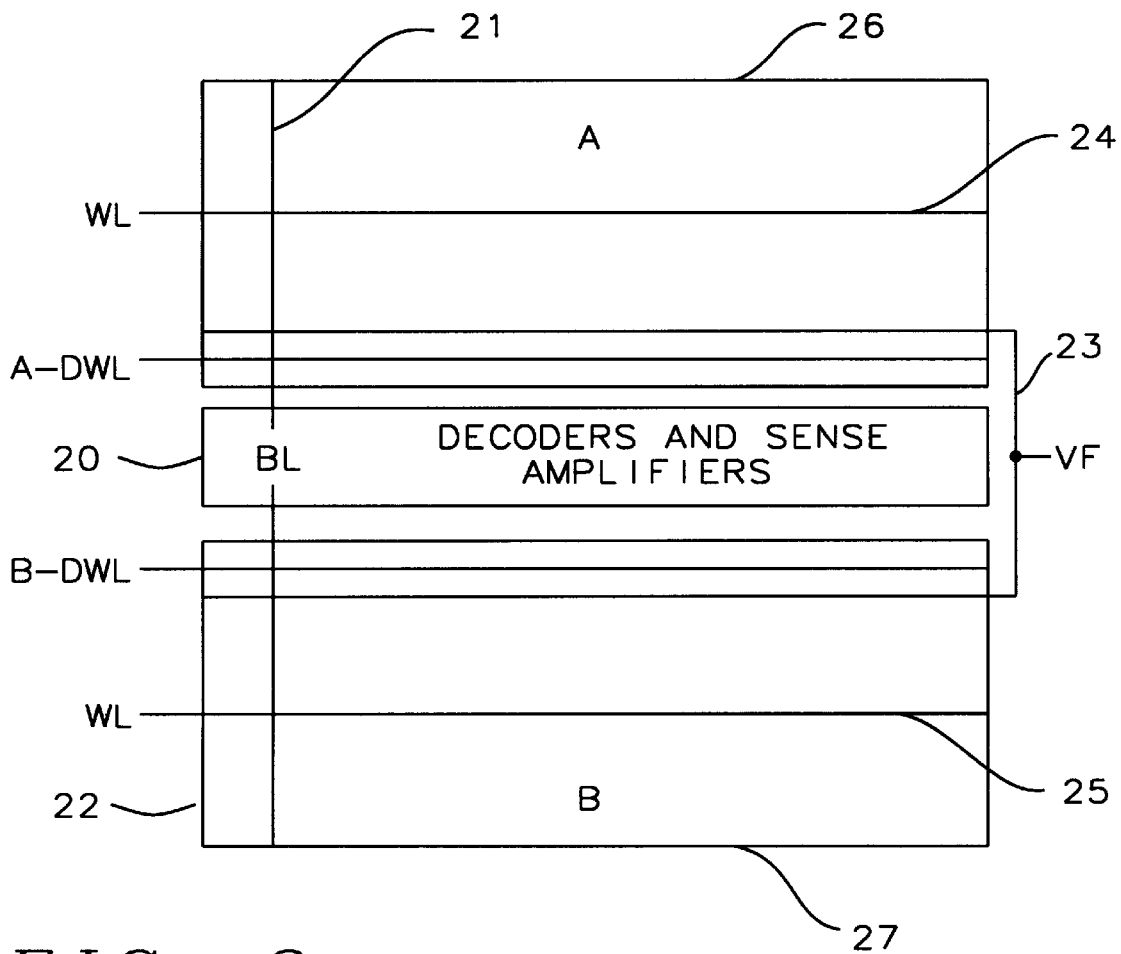
FIG. 2 is a diagram of the layout of reference circuits on a flash memory chip.

In FIG. 2 is a possible layout of a flash memory chip. The chip is partitioned into two memory banks A 26 and B 27. The memory banks A and B are organized into rows and columns of flash memory cells. The rows of memory cells are connected to word lines represented by WL 24 and 25, and the columns of memory cells are connected to bit lines represented BL 21 and 22. Between the two memory banks A and B is a bank of decoders and sense amplifiers 20. The bit lines 21 from memory bank A and bit lines 22 from memory bank B are connected to the sense amplifiers through the decoders. A dummy word line A-DWL near the bottom edge of memory bank A is connected to a row of reference circuits 14. The gate 12 of the control transistor of each reference circuit 14 in the row of reference circuits in memory bank A is connected to the dummy word line A-DWL. To each bit line 21 in memory bank A is connected the drain of a control transistor 10 of a reference circuit 14. Connected to each gate 13 of the reference transistors 11 is the reference voltage line VF 23.

Continuing to refer to FIG. 2, a row of reference circuits 14 is connected to a dummy word line B-DWL positioned near the top of memory bank B 27. The gate 12 of the control transistor 10 of each reference circuit 14 in the row of reference circuits in memory bank B 27 is connected to the dummy word line B-DWL. To each bit line 22 in memory bank B is connected a drain of a control transistor 10 of a reference circuit 14. Connected to each gate 13 of the reference transistors 11 is the reference voltage line VF 23.

Continuing to refer to FIG. 2, a selected word line 24 is shown in memory bank A. When word line 24 is selected, the dummy word line B-DWL is simultaneously selected in memory bank B. Memory cell current is supplied to the decoders and sense amplifiers 20 through bit lines 21 in memory bank A, and reference current is supplied to the decoders and sense amplifiers 20 through bit lines 22 in memory bank B. When word line 25 in memory bank B is selected, the dummy word line A-DWL is simultaneously selected in memory bank A1 Memory cell current is supplied to the decoders and sense amplifiers 20 through bit lines 22 in memory bank B and reference current is supplied to the decoders and sense amplifiers 20 through bit lines 21 in memory bank B. Continuing to refer to FIG. 2, the memory bank that is not activated by a memory word line is used to supply the reference current to the decoders and sense amplifiers simultaneous to the cell current to allow the sense amplifiers to quickly determine the value of the cell current. One of the problems with flash memory is confirming that a memory cell has actually been programmed or erased. The reference voltage 23 can be changed to provide a reference current to verify that a cell is programmed or erased after a program or erase operation. To verify that a cell is programmed a reference current is established that is the maximum expected value of the current of a programmed cell. If a cell current greater than the maximum expected value is detected the cell is defined as not programmed. To verify that a cell is erased a reference current is established that is the minimum expected value of the current of an erased cell. If the cell current is less than the minimum expected value the cell is defined as not erased.

Referring to FIG. 3a, a reference circuit 30 is shown with three reference transistors 31, 32 and 33 connected in parallel and to a control transistor 34. Each reference transistor 31, 32 and 33 have gates connected to different reference voltages VF0, VF1 and VF2. The drains of the reference transistors 31, 32 and 33 are connected together and further connected to the source of the control transistor 34. The sources of the reference transistors 31, 32 and 33 are connected to circuit ground. The gate of the control transistor is connected to a dummy word line DWL and the drain of the control transistor connects the reference current of the reference circuit 30 to a bit line BL. The reference voltages VF0, VF1 and VF2 can be set independently where each reference voltage produces a reference current that is used to compare against a cell current. Or the reference currents could be used incrementally where the reference current caused by VF1 is added to the reference current caused by VF0 to compare with a cell current and the reference current caused be VF2 could be incrementally added to the reference currents from VF0 and VF1 The ability to produce a plurality of reference currents from a reference circuit 30 facilitates reading of multi-bit cells.

In FIG. 3b is shown another way in which multiple reference currents can be produced by reference circuits connect to the same bit line BL. Three reference circuits 40, 41 and 42 are each connected to bit line BL. Each reference circuit 40, 41 and 42 have the same circuit configuration as the reference circuit in FIG. 1. Three separate dummy word lines DWL0, DWL1 and DWL2 are used to connect the reference current caused by VF0, VF1 and VF2 to the bit line BL. The disadvantage of the configuration of FIG. 3b compared to the configuration of FIG. 3a is the two extra connections to the bit line and the 2 extra dummy word lines; however, layout within the same memory cell bit line pitch is straight forward and simple.

In FIG. 4 is shown approximate values of reference voltage $V_F$ and reference current $I_{REF}$ for a single bit flash memory cell to demonstrate how a reference circuit can be used to read and verify a flash memory cell. When reading a memory cell, the reference voltage $V_F$ connected to the gate 13 of a reference transistor 11 is set at approximately about 1.5 volts midway between the program verify and the erase verify settings to produce a reference voltage $I_{REF}$ of approximately about 35 uA. In this example a cell current less than 35 uA would produce one logical value when compared to $I_{REF}$ and a cell current higher than 35 uA would produce another logical value.

Continuing to refer to FIG. 4, to verify that a cell has been programmed a maximum programmed cell current is set as the reference current. Any cell having a current larger than the maximum programmed cell current would be considered as not being programmed. In the example shown in FIG. 3 a reference voltage $V_F$ of approximately about 1.0 volts would create a maximum programmed cell current of approximately about 10 uA. Thus in this example any cell current greater than 10 uA would be defined as the memory cell not being programmed. To verify that a cell has been erased a minimum erased cell current is set as the reference current Any cell having a current smaller than the minimum erased cell current would be considered as not being erased. In the example shown in FIG. 3 a reference voltage $V_F$ of approximately about 2.0 volts would create a minimum erased cell current of approximately about 60 uA. Thus in this example any cell current less than 60 uA would be defined as the memory cell not being erased.

Figure 5:
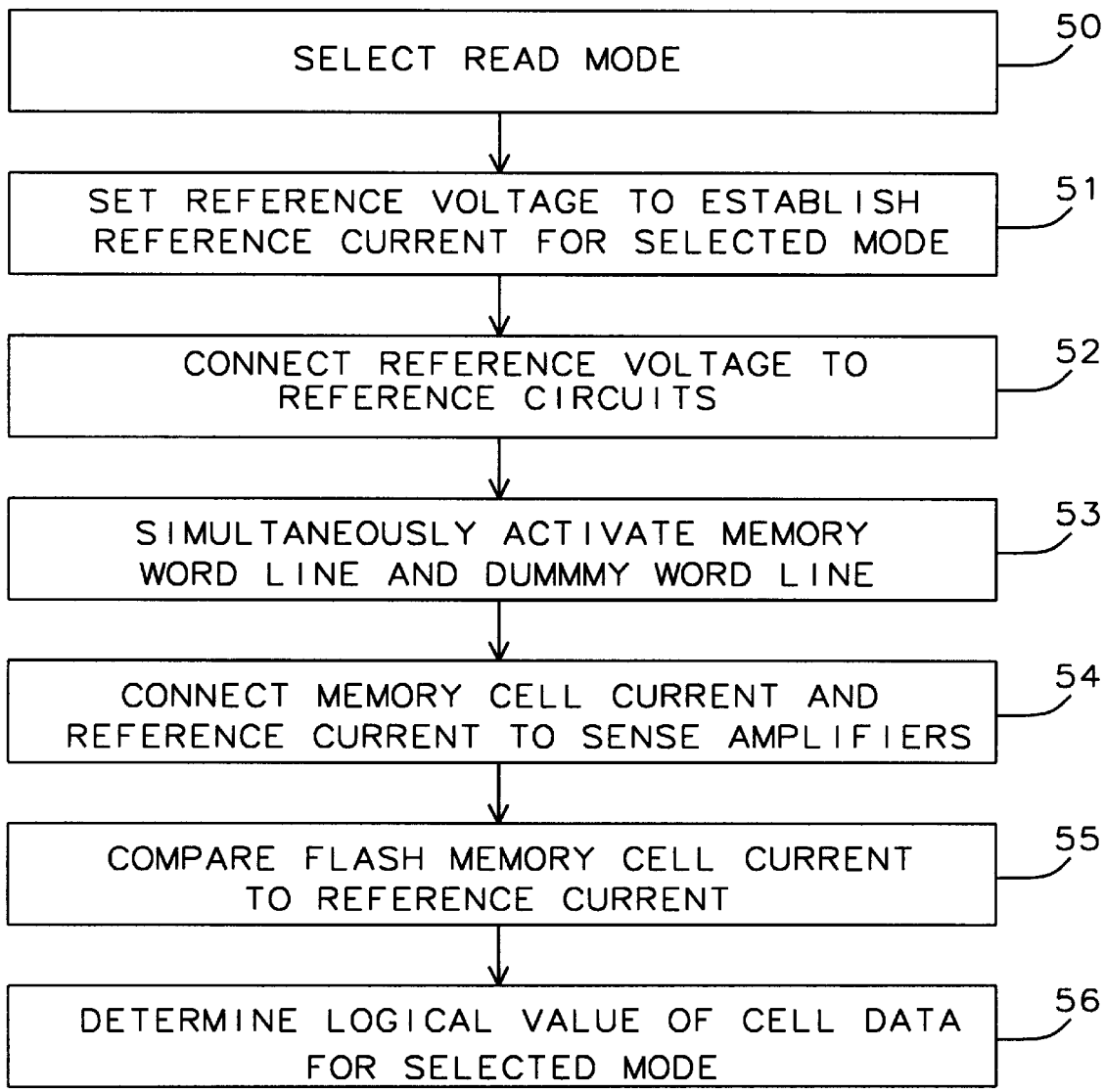
FIG. 5 is a flow diagram for the method of determining the value of memory cell data.

In FIG. 5 is shown a flow diagram for determining the value of memory cell data for a selected mode. A read, a cell program verify or a cell erase verify mode is selected 50. Then the reference voltage that is connected to the gate 13 of the reference transistor 11 is set to establish the reference current for the selected mode 51. The reference voltage is connected to the reference circuits 52, and simultaneously a memory word line and a dummy word line are activated 53. This simultaneous activation of the memory word line and the dummy word line allows the sense amplifiers to resolve the relationship between the two currents faster because perturbations affecting both currents can be canceled in the differential sense amplifiers. The reference current and memory cell current are connected to the sense amplifiers after flowing through a simple decoder such as a Y decoder 54. The memory cell current of the flash memory is compared to the reference current in the sense amplifiers 55, and the logical of the cell data is determined for the selected mode 56.

While the invention has been particularly shout and described with reference to preferred embodiments thereof, it will be understood by those skilled in the art that various changes in form and details may be made without departing from the spirit and scope of the invention.

What is claimed is:

1. A reference circuit for flash memories, comprising:
   a) a first transistor and a second transistor connected in series with a source of said first transistor connected to a drain of said second transistor,
   b) a source of said second transistor connected to a source line,
   c) a drain of said first transistor connected to a first bit line of a flash memory,
   d) a gate of said first transistor connected to a dummy word line,
   e) a gate of said second transistor connected to a reference voltage,
   f) said reference voltage set to produce a reference current,
   g) said reference current connected to a sense amplifier through said first bit line,
   h) a current from an accessed memory cell connected to said sense amplifier through a second bit line,
   i) said sense amplifier comparing said current from said memory cell to said reference current to read data stored in said memory cell.

2. The reference circuit of claim 1, wherein said flash memory is program verified by changing said reference current to a value that is a maximum expected current for said program state and comparing to current from said memory cell.

3. The reference circuit of claim 1, wherein said flash memory cell is erase verified by changing said reference current to a value flat is a minimum expected current for said erase state and comparing to current from said memory cell.

4. The reference circuit of claim 1, wherein a row of reference circuits is accessed by a dummy wordline each connected to a bit that is connected to flash memory cells not being accessed and providing said reference current to a plurality of sense amplifiers to enable said sense amplifiers to determine the logical value stored in flash memory cells that are being accessed.

5. The reference circuit of claim 1, wherein a plurality of transistors each with a gate connected to a reference voltage are connected in parallel with said second transistor to produce a plurality of reference currents to allow sense amplifiers to determine a plurality of logical states and logical conditions of said flash memory cells.

6. The reference circuit of claim 1, wherein a plurality of reference circuits are connected to a same bit line to provide a plurality Deference currents to said sense amplifier and selected by a plurality of dummy word lines.

7. The reference circuit of claim 1, wherein the function of the first transistor and the second transistor are interchanged connecting said gate of said first transistor to said reference voltage and connecting said gate of said second transistor to said dummy word line.

8. A circuit for read reference for flash memories, comprising:
   a) a flash memory organized into a first memory bank and a second memory bank,
   b) said flash memory further organized into rows and columns of memory cells,
   c) said rows of memory cells connected to word lines and said columns of memory cells connected to bit lines,
   d) a first row of reference circuits connected to bit lines in said first memory bank, and a second row of reference circuits connected to bit lines in said second memory bank,
   e) said first and said second row of reference circuits connected to a reference voltage,
   f) said first row of reference circuits connected to a first dummy word line and said second row of reference circuits connected to a second dummy word line,
   g) said reference circuit providing a reference current from which the state of a flash memory cell can be determined.

9. The circuit of claim 8, wherein said first row of reference circuits is accessed when a row of memory cells in said second memory bank is accessed, and said second row of reference circuits is accessed when a row of memory cells in said first memory bank is accessed.

10. The circuit of claim 8, wherein said reference circuits comprises a first and second transistor connected in series between a bit line and a source line with a gate of said first transistor connected to a dummy word line of said first and second dummy word lines and a gate of said second transistor connected to said reference voltage.

11. The circuit of claim 10, wherein a plurality of transistors with a plurality of gate connected reference voltages are connected in parallel to said second transistor of said reference circuit to provide a plurality of reference currents.

12. The circuit of claim 8, wherein said reference voltage for a flash memory read is set at a voltage to produce a current approximately half way between a current for a programmed flash memory cell and a current for an erased flash memory cell.

13. The circuit of claim 8, wherein a plurality of reference circuits can be connected to a same bit line where each of said plurality of reference circuits are attached to a plurality of dummy word lines and a plurality of reference voltages to provide a plurality of reference currents.

14. The circuit of claim 8, wherein said reference current can be set to read stored data from a memory cell, to verify memory cell is programmed and to verify a memory cell is erased.

15. A method of determining a value stored in a flash memory cell and condition of said memory cell, comprising:
   a) selecting a read mode,
   b) setting a reference voltage to establish a reference current for said read mode,
   c) connecting a reference voltage to a plurality of reference circuits,
   d) activating a memory word line and a dummy word line simultaneously,
   e) connecting memory cell current and reference current to sense amplifiers,
   f) comparing said memory cell current to said reference current
   g) determining logical value of memory cell data for selected mode.

16. The method of claim 15, wherein comparing said reference current to said memory current determines programmed and erased state of said memory cell when using appropriate mode reference currents established with said reference voltage.

17. The method of claim 15, wherein activating said dummy word line connects reference currents to bit lines not connected to memory cells being read.

* * * * *